United States Patent
Dai et al.

(10) Patent No.: US 12,424,824 B2
(45) Date of Patent: Sep. 23, 2025

(54) VERTICAL-CAVITY SURFACE-EMITTING SEMICONDUCTOR LASER DIODE WITH THE MODE FILTER

(71) Applicant: VISUAL PHOTONICS EPITAXY CO., LTD., Taoyuan (TW)

(72) Inventors: Van-Truoung Dai, Vinhphuc Province (VN); Yu-Chung Chin, Taoyuan (TW); Chao-Hsing Huang, Taoyuan (TW); Van-Chien Nguyen, Hai phong (VN)

(73) Assignee: VISUAL PHOTONICS EXPITAXY CO., LTD, Taoyuan (TW)

(*) Notice: Subject to any disclaimer, the term of this patent is extended or adjusted under 35 U.S.C. 154(b) by 0 days.

(21) Appl. No.: 17/965,462

(22) Filed: Oct. 13, 2022

(65) Prior Publication Data
US 2023/0116144 A1    Apr. 13, 2023

(30) Foreign Application Priority Data

| Oct. 13, 2021 | (TW) | 110137973 |
| Nov. 3, 2021 | (TW) | 110140913 |
| Mar. 17, 2022 | (TW) | 111109754 |
| Apr. 29, 2022 | (TW) | 111116440 |

(51) Int. Cl.
*H01S 5/183* (2006.01)
*H01S 5/042* (2006.01)
*H01S 5/065* (2006.01)

(52) U.S. Cl.
CPC ...... *H01S 5/18394* (2013.01); *H01S 5/04256* (2019.08); *H01S 5/0653* (2013.01); *H01S 5/18311* (2013.01); *H01S 5/1833* (2013.01); *H01S 5/18341* (2013.01)

(58) Field of Classification Search
CPC .......... H01S 5/18311; H01S 5/04252; H01S 5/18313; H01S 5/18386; H01S 5/183–18397; H01S 5/42–426; H01S 5/18394
See application file for complete search history.

(56) References Cited

U.S. PATENT DOCUMENTS 5,633,527 A * 5/1997 Lear ............... H01L 31/02327
                                                 372/50.23
5,838,715 A * 11/1998 Corzine ............ H01S 5/18388
                                                 372/50.1

(Continued)

FOREIGN PATENT DOCUMENTS

EP      1496583 A1 *  1/2005  ........ H01S 5/18344

OTHER PUBLICATIONS

Office action for corresponding Taiwan Patent Application No. 111138715 dated Jul. 4, 2023, 10 pages long.

*Primary Examiner* — Tod T Van Roy
(74) *Attorney, Agent, or Firm* — Birch, Stewart, Kolasch & Birch, LLP

(57) ABSTRACT

Provided is a vertical-cavity surface-emitting semiconductor laser diode, including a substrate and an epitaxial stack structure disposed on the substrate. The epitaxial stack structure includes an active region, a current confinement layer and a mode filter layer. The mode filter layer includes an optical aperture, and the mode filter layer is able to be oxidized. Accordingly, the optical aperture of the mode filter layer is formed by oxidizing the mode filter layer.

10 Claims, 15 Drawing Sheets

(56) References Cited

U.S. PATENT DOCUMENTS

| | | | | |
|---|---|---|---|---|
| 5,881,085 A * | 3/1999 | Jewell | ...................... | G02B 3/00 |
| | | | | 372/50.23 |
| 6,590,917 B2 * | 7/2003 | Nakayama | .............. | H01S 5/423 |
| | | | | 372/45.01 |
| 6,959,025 B2 * | 10/2005 | Jikutani | ................ | H01S 5/1833 |
| | | | | 372/92 |
| 7,858,410 B2 * | 12/2010 | Watanabe | ........... | H01S 5/18388 |
| | | | | 257/E21.328 |
| 8,385,381 B2 * | 2/2013 | Maeda | ................ | H01S 5/18391 |
| | | | | 372/46.013 |
| 9,742,154 B2 * | 8/2017 | Dallesasse | .......... | H01S 5/18394 |
| 10,658,817 B2 * | 5/2020 | Gerlach | ................ | H01S 5/423 |
| 11,456,575 B2 * | 9/2022 | Yuen | ................... | H01S 5/18322 |
| 12,015,245 B2 * | 6/2024 | Tandoi | ................ | H01S 5/18391 |
| 2003/0039294 A1 * | 2/2003 | Ueki | ................... | H01S 5/04254 |
| | | | | 372/96 |
| 2005/0286596 A1 * | 12/2005 | Mukoyama | ......... | H01S 5/04254 |
| | | | | 372/50.23 |
| 2007/0242716 A1 * | 10/2007 | Samal | ................... | H01S 5/1833 |
| | | | | 372/46.01 |
| 2008/0187015 A1 * | 8/2008 | Yoshikawa | ......... | H01S 5/18333 |
| | | | | 372/45.01 |
| 2010/0111125 A1 | 5/2010 | Kondo | | |
| 2011/0027924 A1 * | 2/2011 | Ikuta | ................... | H01S 5/18333 |
| | | | | 372/46.013 |
| 2018/0226768 A1 * | 8/2018 | Brenner | .............. | H01S 5/18313 |
| 2020/0119521 A1 * | 4/2020 | Feng | ....................... | H01S 5/065 |
| 2021/0057881 A1 * | 2/2021 | Chan | ................... | H01S 5/1833 |
| 2021/0091538 A1 * | 3/2021 | Chen | ................... | H01S 5/0239 |
| 2023/0116144 A1 * | 4/2023 | Dai | .................... | H01S 5/04256 |
| | | | | 372/46.013 |

\* cited by examiner

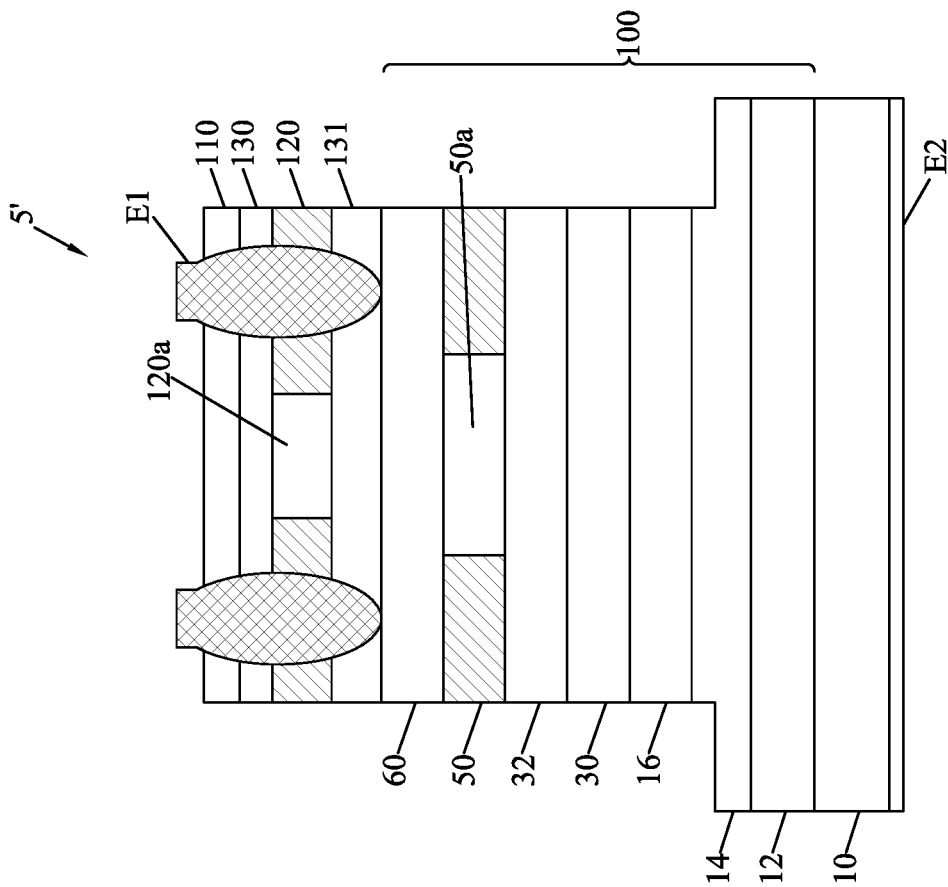
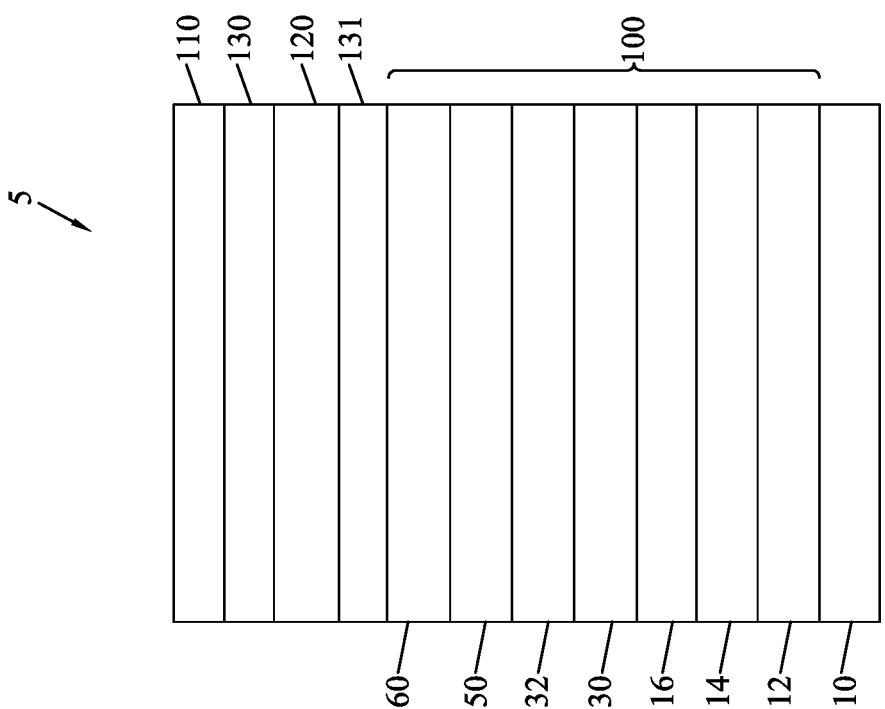
FIG. 6b
FIG. 6a

VERTICAL-CAVITY SURFACE-EMITTING SEMICONDUCTOR LASER DIODE WITH THE MODE FILTER

CROSS-REFERENCE TO RELATED APPLICATION

This application for patent claims priority under 35 U.S.C. 119(a) to Taiwanese Application Serial No. 110137973, filed on Oct. 13, 2021, Taiwanese Application Serial No. 110140913, filed on Nov. 3, 2021, Taiwanese Application Serial No. 111109754, filed on Mar. 17, 2022 and Taiwanese Application Serial No. 111116440, filed on Apr. 29, 2022; the respective entireties of the above-mentioned patent applications are hereby incorporated by reference herein and made a part of this specification.

TECHNICAL FIELD

The technical field relates to a vertical-cavity surface-emitting semiconductor laser diode, especially a semiconductor laser diode with a mode filter layer.

BACKGROUND

FIG. 1 shows a semiconductor laser diode with a small divergence angle. As shown in FIG. 1, the surface relief layer 240 having an optical aperture 241 is the top layer of the semiconductor laser diode. The oxidation layer 230 having an oxide aperture 231 is usually formed between the surface relief layer 240 and the active region 220. The optical aperture 241 of the surface relief layer 240 is formed by the lithography and etching process. The oxide aperture 231 is formed by the oxidizing process. Since the fabricated processes of the optical aperture 241 and the oxide aperture 231 are different, the center axis thereof are not easy to be aligned precisely. Accordingly, the divergence angle of the semiconductor laser diode will be larger. Furthermore, in mass production of semiconductor laser diodes, it is often to be found that the center axis of the oxide aperture 231 and the optical aperture 241 cannot be aligned consistently such that the divergence angles of the semiconductor laser diodes cannot be consistent and cannot be smaller.

Please refer to US Patent Publication No. US 2021/0057881 A1. According to this patent application disclosure, a plurality of oxidation layers with different sizes of openings are formed between the upper DBR layer and the active region, thereby narrowing the divergence angle by means of the openings with different sizes. Although the multiple oxidation layers can be simultaneously oxidized and the centers thereof can be more precisely aligned with each other. However, it is well known that the conductivity of the oxidized portion of each oxidation layer is very low (i.e. high resistance), and multiple oxidation layers with high resistance are arranged on the path where most of the current flows. As such, the appreciable resistance accumulated by these oxidation layers will seriously affect the power conversion efficiency of the VCSEL and prolong the rising time of the pulses. Accordingly, the VCSELs of this patent are also not easy to generate short pulses.

SUMMARY

In the technology field of VCSEL, a current confinement layer is usually used to confine current into the center area of an active region such that the current confinement layer is usually disposed near the active region or in the active region. However, the resistance of a single current confinement layer is quite large such that the number of oxidation layers should not be too many. Generally, in the existing VCSELs with a small divergence angle, a surface relief is arranged as the uppermost layer of a VCSEL. Accordingly, the placement position of the surface relief layer is limited.

The embodiments of the present disclosure provide VCSELs with a small divergence angle, wherein include a mode filter layer having optical aperture, and the mode filter layer can be oxidized laterally, wherein the optical aperture is formed after the mode filter layer is oxidized. When the mode filter layer and the current confinement layer are oxidized at the same time, the current confinement aperture and the optical aperture will have the same center axes. As a result, the divergence angle of the VCSEL is smaller. For multiple semiconductor laser diodes, the divergence angles of multiple semiconductor laser diodes are smaller and consistent. Furthermore, when the mode filter layer and the current confinement layer are oxidized simultaneously, the present disclosure can also simplify the manufacturing process of the VCSEL and improve the manufacturing yield of the VCSEL.

BRIEF DESCRIPTION OF THE DRAWINGS

FIG. 6a is a schematic diagram showing a VCSEL epitaxial wafer structure in which the first ohmic contact layer is indirectly disposed above the mode filter layer according to an embodiment of the present disclosure.

FIG. 6b is a schematic diagram showing the fabrication of the VCSEL epitaxial wafer structure of FIG. 6a into a possible VCSEL semi-finished device, and the first metal electrode of FIG. 6 is formed by an alloy process.

DESCRIPTION OF THE EMBODIMENTS

Figure 1:
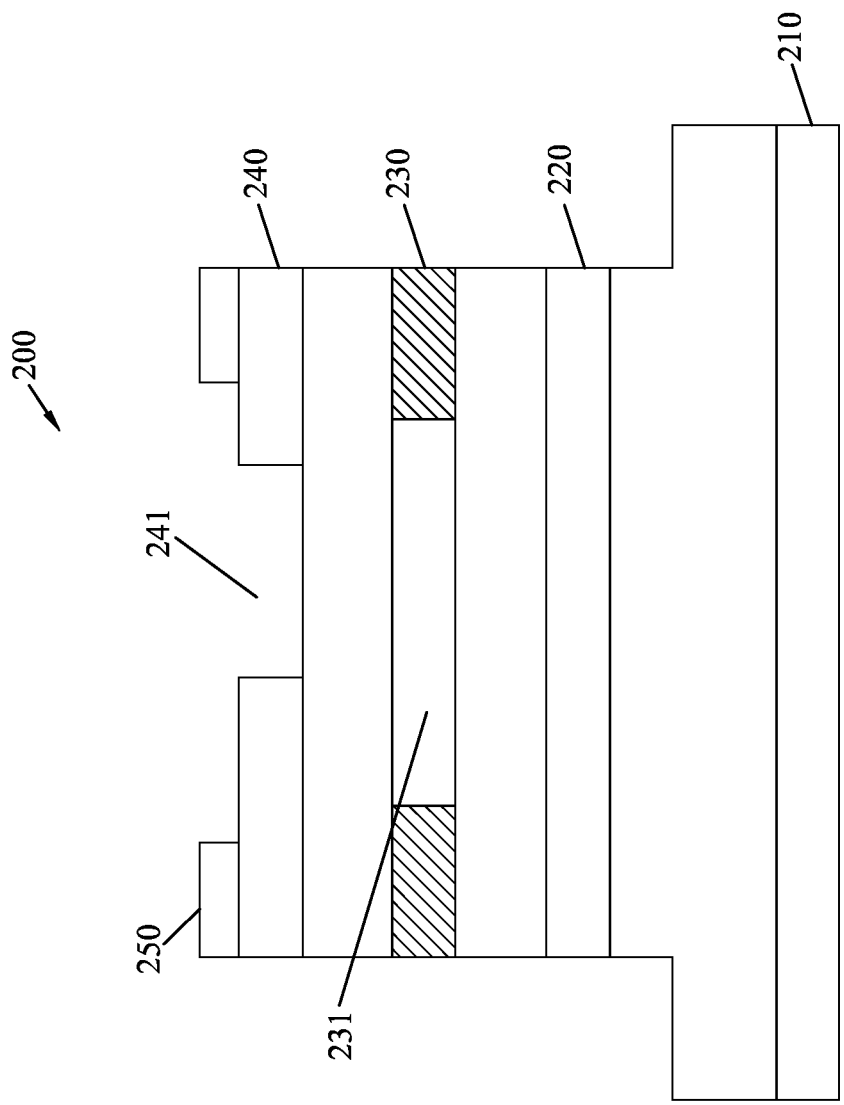
FIG. 1 is a schematic diagram showing a semiconductor laser diode with a small divergence angle.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

Previously, a laser diode can be selectively provided with a buffer layer according to actual needs. In some examples, the buffer layer may be the same material as a substrate. Whether the buffer layer is provided or not is not substantially related to the technical features and effects to be provided in the following embodiments. Therefore, in order to illustrate briefly, the following embodiments only use a laser diode with a buffer layer as an example for illustration. However, the laser diode without the buffer layer will not be repeatedly described, that is, the laser diode without the buffer layer in the following embodiments will not be repeated.

Figure 2:
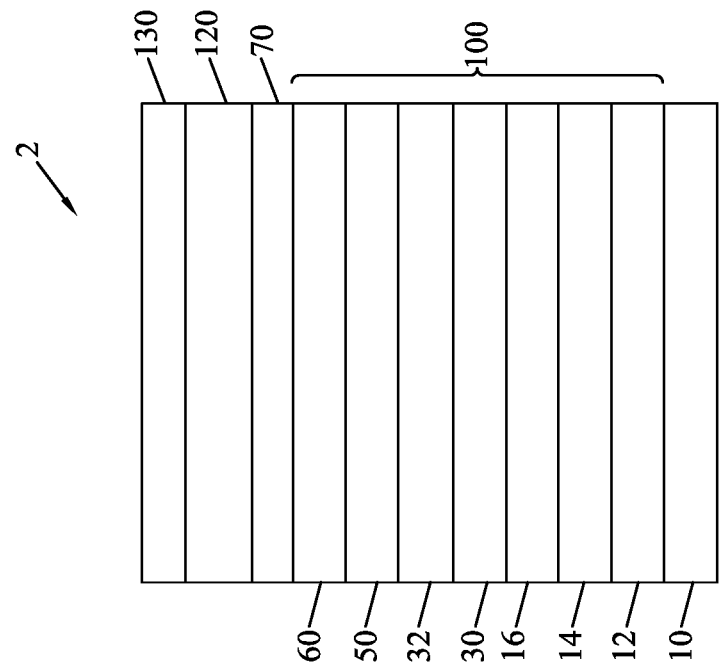
FIG. 2 is a schematic diagram showing a vertical-cavity surface-emitting laser (VCSEL) epitaxial wafer structure according to an embodiment of the present disclosure.

As shown in FIG. 2, an epitaxial stack structure 100 is epitaxially grown on the substrate 10, and the epitaxial stack structure 100 includes an active region 30 and an current confinement layer 50. Although the epitaxial layers such as a buffer layer 12, a lower spacer layer 14 and an upper spacer layer 32 are also drawn in FIG., 2 or other drawings, one or some of these epitaxial layers may not be disposed, or more epitaxial layers may be further disposed according to actual needs.

Figure 3:
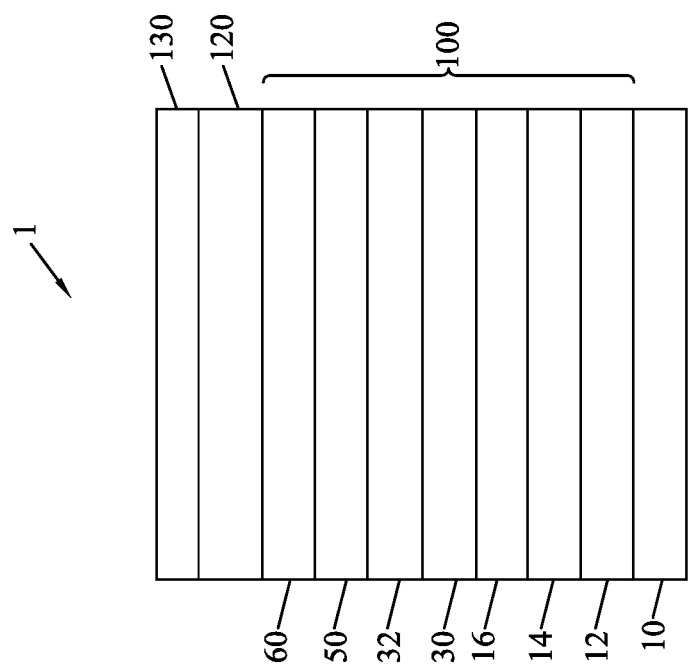
FIG. 3 is a schematic diagram showing a VCSEL epitaxial wafer structure provided with a spacer layer according to an embodiment of the present disclosure.

An mode filter layer 120 and a first semiconductor layer 130 are sequentially formed on the epitaxial stack structure 100. The first semiconductor layer covers the mode filter layer 120 to prevent the mode filter layer 120 from being oxidized due to exposure. Compared with FIG. 2, the VCSEL epitaxial wafer structure 2 in FIG. 3 is further provided with a spacer layer 70, the spacer layer 70 is disposed between the upper DBR layer 60 and the mode filter layer 120. In some embodiments, the spacer layer 70 may also be disposed above the upper DBR layer 60, below the mode filter layer 120, or at other suitable positions. Besides, the spacer layer 70 may be used as an ohmic contact layer.

In one or some embodiments, the active region 30 includes one or more active layers (not shown). For example, when the active region 30 includes two active layers, a tunnel junction is disposed between the two active layers, and the tunnel junction is used to connect the two active layers in series. In addition, an active layer includes one or more quantum well structures.

Figure 4B:
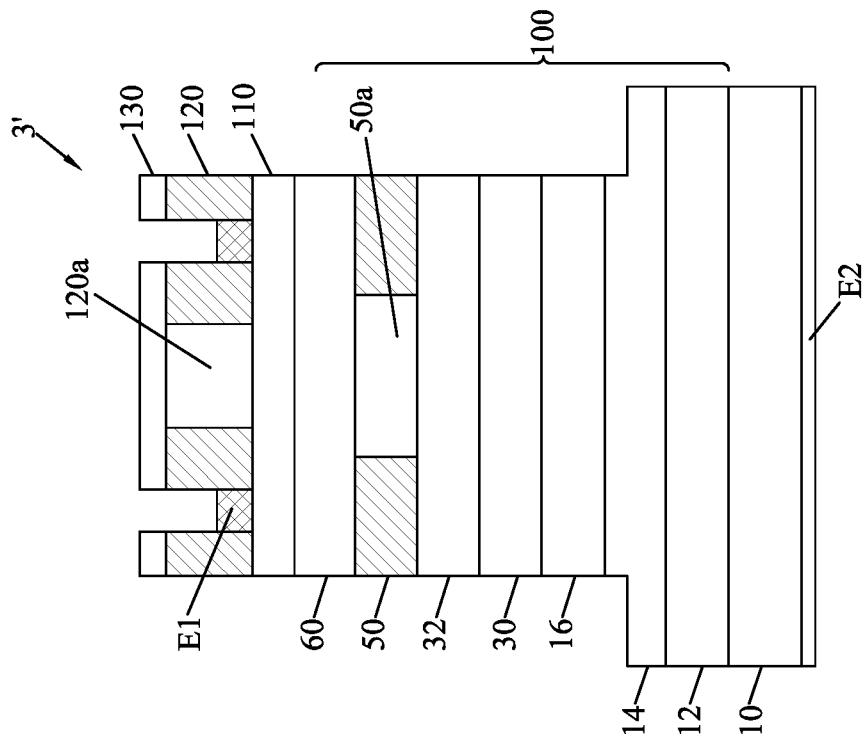
FIG. 4b is a schematic diagram showing the fabrication of the VCSEL epitaxial structure of FIG. 4a into a possible VCSEL semi-finished device.
Figure 4A:
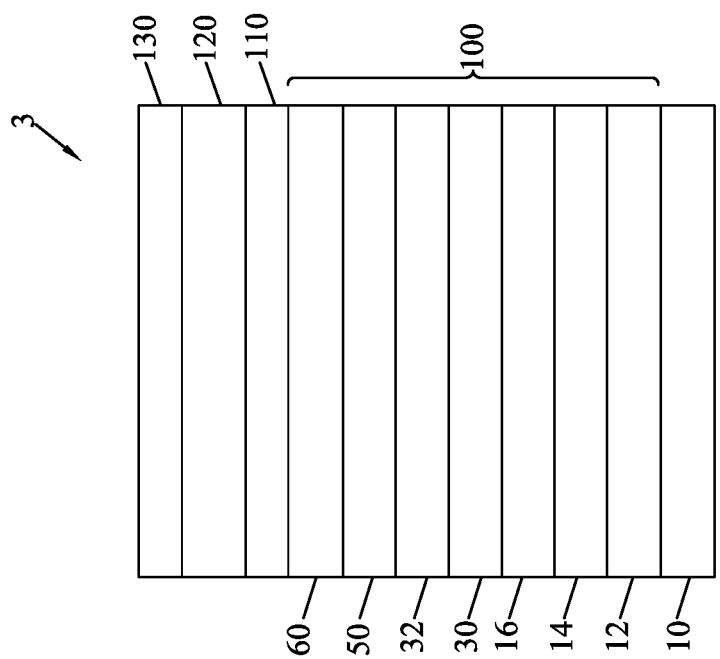
FIG. 4a is a schematic diagram showing a VCSEL epitaxial wafer structure provided with a first ohmic contact layer in direct contact with a mode filter layer according to an embodiment of the present disclosure.

Compared with FIG. 2, the VCSEL epitaxial wafer structure 3 in FIG. 4a is further provided with a first ohmic contact layer 110, the first ohmic contact layer 110 is disposed between the upper DBR layer 60 and the mode filter layer 120. Regarding the current confinement layer 50, the position and number thereof are not limited to FIG. 4a.

The current confinement layer may also be disposed within, above and/or below the active region. For example, the current confinement layer may be disposed between the lower DBR layer and the upper DBR layer, or may be disposed in the upper DBR layer or in/near the lower DBR layer. When both the current confinement layer and the mode filter layer are in the upper DBR layer, the current confinement layer is closer to the active region than the mode filter layer.

Figure 4C:
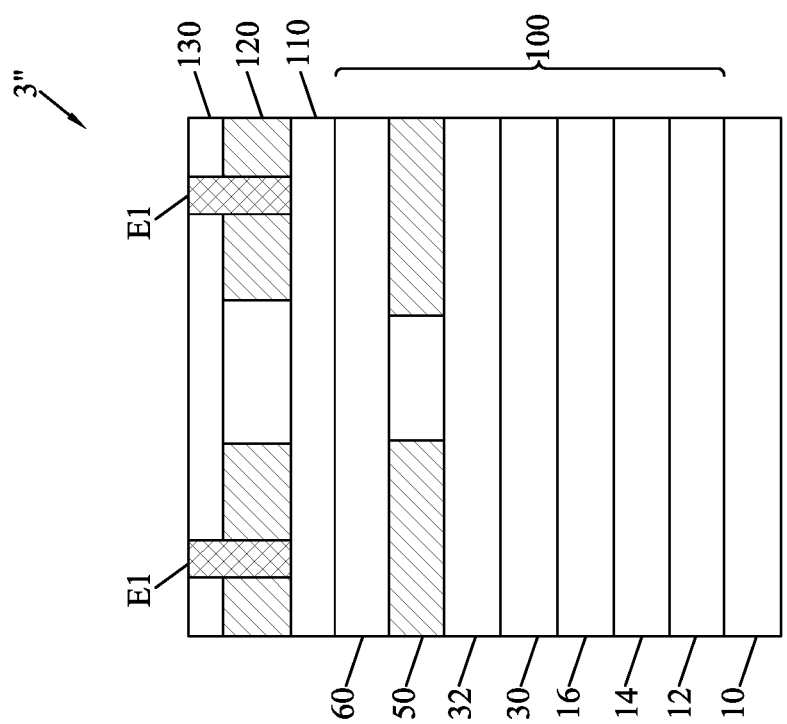
FIG. 4c is a schematic diagram showing the first metal electrode being flush with the top surface of the VCSEL semi-finished device according to an embodiment of the present disclosure.

The VCSEL epitaxial wafer structure 3 of FIG. 4a can be fabricated into various VCSEL semi-finished devices, one of which is the VCSEL semi-finished device 3', as shown in FIG. 4b. According to FIG. 4b, the main current path is to flow through the first metal electrode E1, the first ohmic contact layer 110, the upper DBR layer 60 and the first current confinement aperture 50a, and then flow into the active region 30. It is worth mentioning that the first metal electrode E1 is in ohmic contact with the first ohmic contact layer 110. Although the resistance of the mode filter layer is large, the optical aperture 120a of the mode filter layer is not on the main current path such that the resistance of the mode filter layer has little or no effect on the performance of the VCSEL. In addition, the position and height of the first metal electrode E1 are not limited to FIG. 4b. Alternatively, as shown in FIG. 4c, the top surface of the first metal electrode E1 may be flush with the top surface of the VCSEL semi-finished device 3'.

Figure 5B:
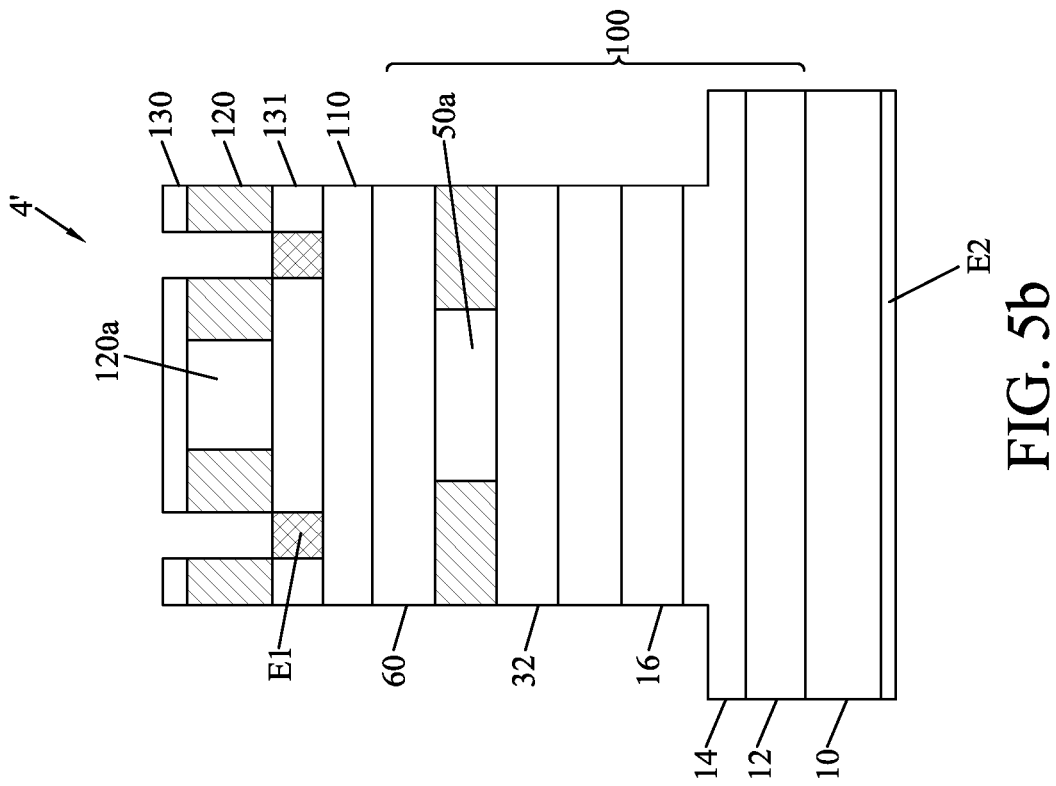
FIG. 5b is a schematic diagram showing the fabrication of the VCSEL epitaxial wafer structure of FIG. 5a into a possible VCSEL semi-finished device.
Figure 5A:
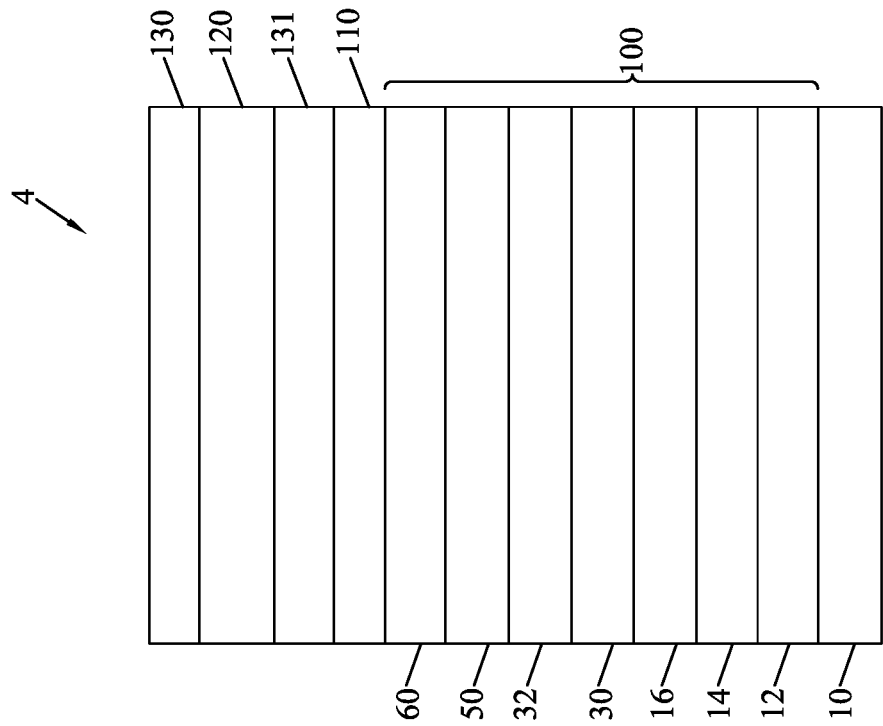
FIG. 5a is a schematic diagram showing a VCSEL epitaxial wafer structure in which the first ohmic contact layer indirectly contacts the mode filter layer according to an embodiment of the present disclosure.

Compared with FIG. 4a, in FIG. 5a, a second semiconductor layer 131 is further disposed between the mode filter layer 120 and the first ohmic contact layer 110. The second semiconductor layer 131 is selectively disposed in accordance with the design of the epitaxial structure. In FIG. 5b, the optical aperture 120a is also not on the main current path, and the position of the first metal electrode E1 is not limited to FIG. 5b.

The second semiconductor layer 131, the mode filter layer 120, the first semiconductor layer 130 and the first ohmic contact layer 110 are sequentially disposed on the epitaxial stack structure 100, as shown in FIG. 6a.

The first metal electrode E1 can be formed by a non-alloy process, an alloy process or other suitable process. FIG. 4b, FIG. 4c, FIG. 5b, FIG. 7c or FIG. 10b is an embodiment of forming the first metal electrode E1 by the non-alloy process, which removes a portion of the oxidized portion of the mode filter layer 120 such that a portion of the surface of the first ohmic contact layer 110 is exposed. Next, the second metal electrode is deposited on the exposed surface of the first ohmic contact layer. As shown in FIG. 6b, a first metal electrode (e.g., an alloy electrode) is formed through one or several layers by an alloy process.

Figure 7B:
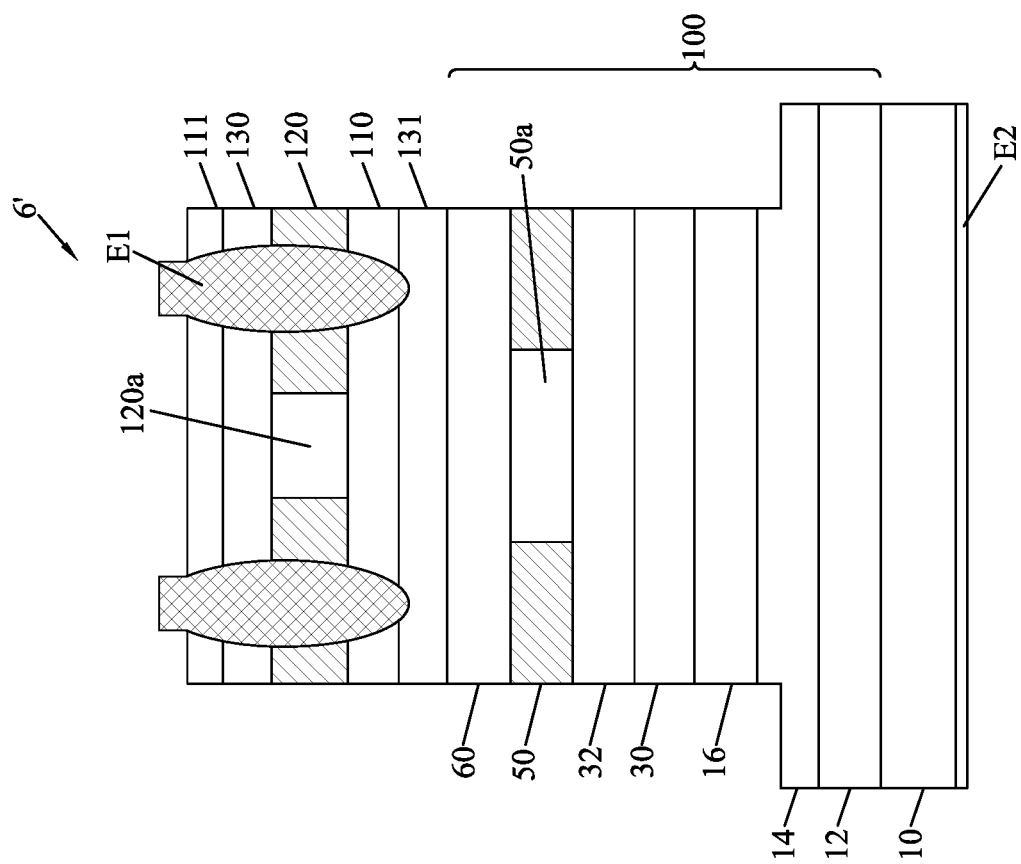
FIG. 7b is a schematic diagram showing the fabrication of the VCSEL epitaxial wafer structure of FIG. 7a into a possible VCSEL semi-finished device.
Figure 7A:
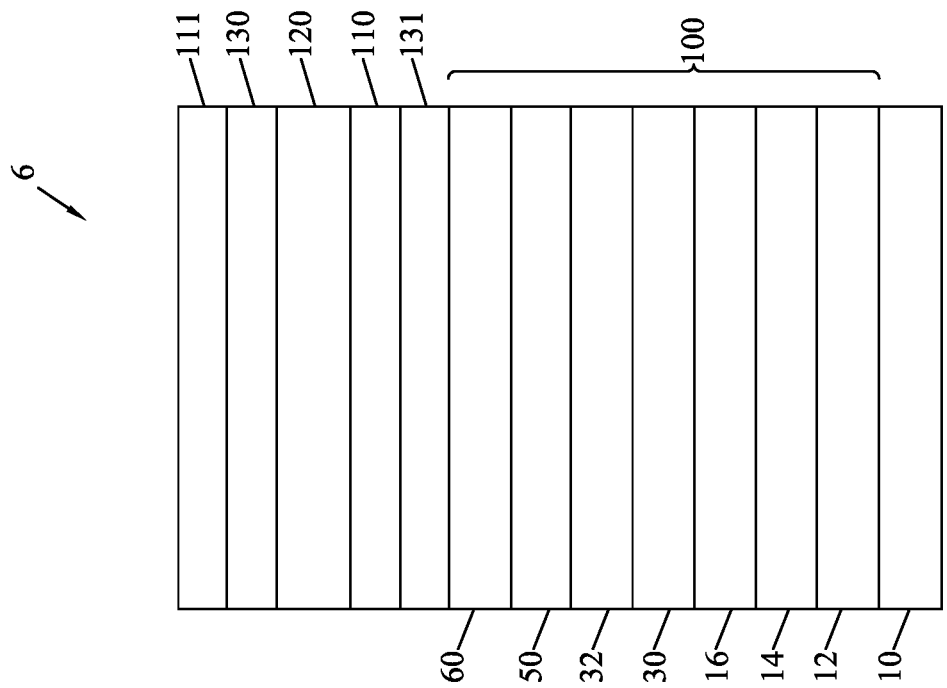
FIG. 7a is a schematic diagram showing a VCSEL epitaxial wafer structure in which a mode filter layer is disposed between two ohmic contact layers according to an embodiment of the present disclosure.
Figure 7C:
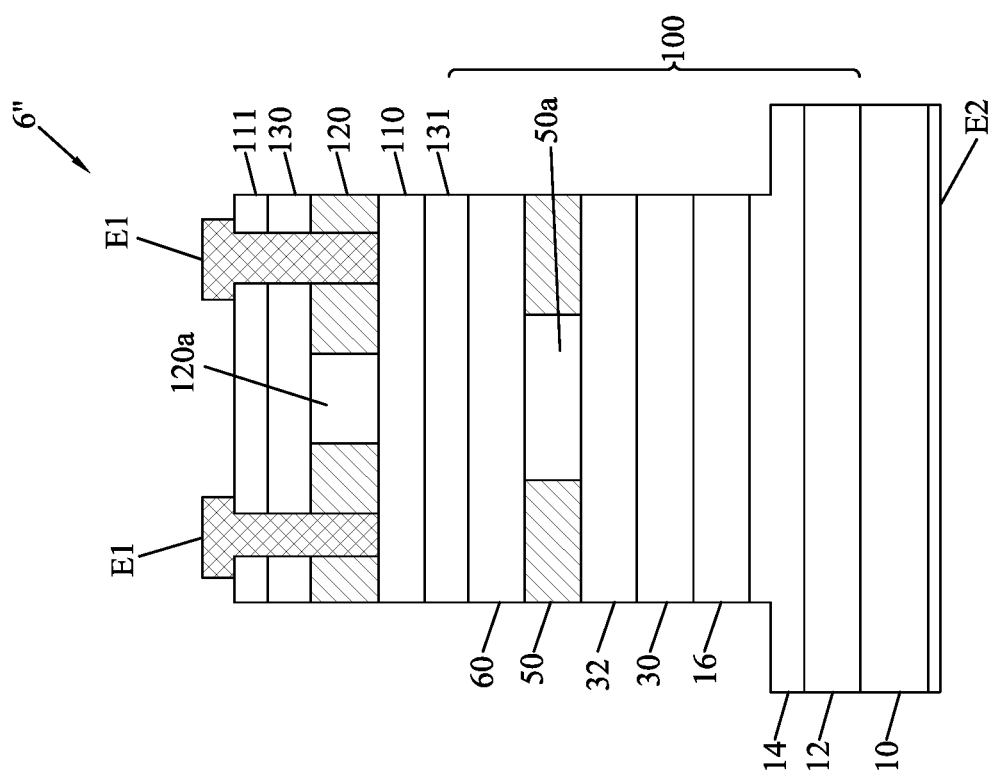
FIG. 7c is a schematic diagram of forming a first metal electrode electrically connecting the first ohmic contact layer and the second ohmic contact layer by means of non-alloy process.

As shown in FIG. 7a, the second semiconductor layer 131, the first ohmic contact layer 110, the mode filter layer 120, the first semiconductor layer 130 and the second ohmic contact layer 111 are sequentially formed on the epitaxial stack structure 100. Preferably, the first ohmic contact layer, the semiconductor layer adjacent to the first ohmic contact layer, the second ohmic contact layer, the semiconductor layer adjacent to the second ohmic contact layer, or two or more of the above are doped with appropriate elements. For example, "the second semiconductor layer 131, the first ohmic contact layer 110, the first semiconductor layer 130 and the second ohmic contact layer 111" can all be p-type dopant or n-type dopant. For example, the n-type first (second) ohmic contact layer, the first semiconductor layer 130 or the second semiconductor layer 131 may be further doped with Si, Se, Sn (Stannum), Ge or Te. The p-type first (second) ohmic contact layer, the first semiconductor layer 130 or the second semiconductor layer 131 may be further doped with Zn, C or Be. The first metal electrode and/or the second metal electrode (ohmic contact metal) may be n-type or p-type. The material of n-type first metal electrode and/or the second metal electrode include(s) Ge, Ge/Ni, Sn, gold-germanium or gold-germanium-nickel, etc. The material of p-type first metal electrode and/or the second metal electrode include(s) Zn, Mg and Be alloys. In one or some embodiments, the first semiconductor layer, the second semiconductor layer, or both of the above are selectively disposed according to different actual needs.

The VCSEL epitaxial wafer structure 6 of FIG. 7a can be fabricated into various VCSEL semi-finished devices, one of which is the VCSEL semi-finished device 6', as shown in FIG. 7b. According to FIG. 7b, the main current path is to flow through the first metal electrode E1, the second semiconductor layer 131, the upper DBR layer 60 and the first current confinement aperture 50a, and then flow into the active region 30.

Figure 8:
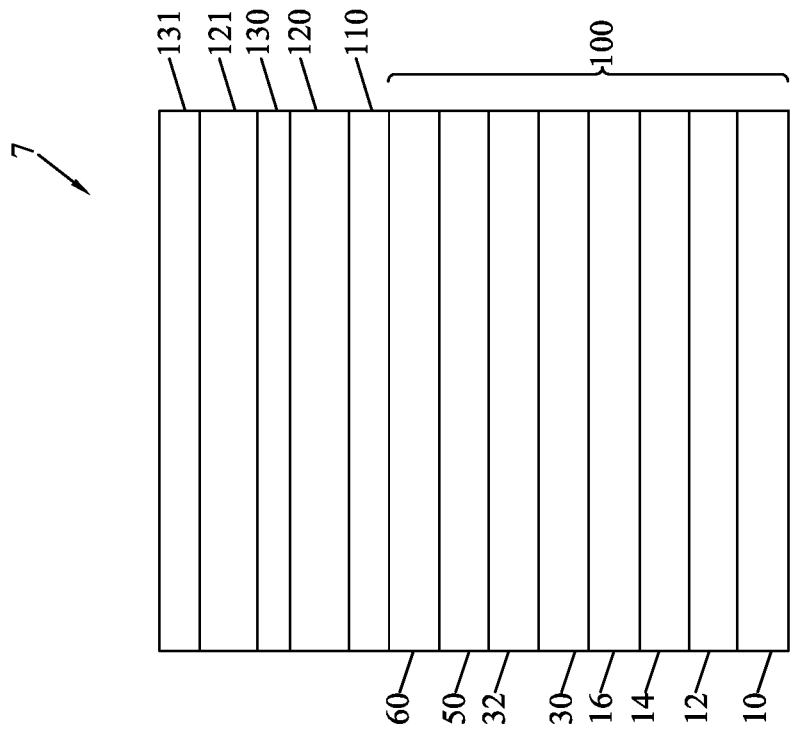
FIG. 8 is a schematic diagram showing the structure of a top-emitting VCSEL epitaxial wafer including a plurality of mode filter layers and a plurality of semiconductor layers according to an embodiment of the present disclosure.
Figure 9:
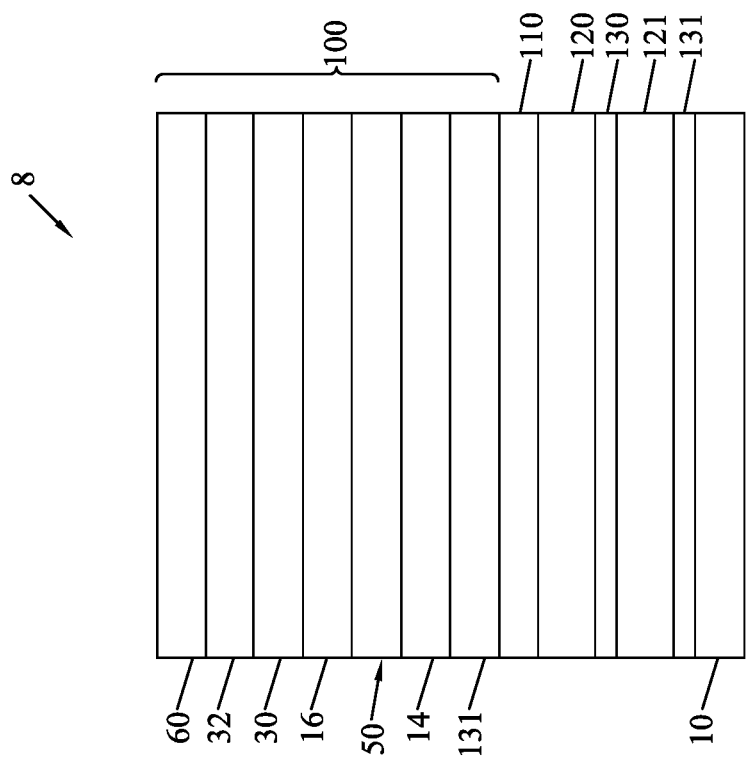
FIG. 9 is a schematic diagram showing the structure of a bottom-emitting VCSEL epitaxial wafer including a plurality of mode filter layers and a plurality of semiconductor layers according to an embodiment of the present disclosure.

FIG. 8 shows a top-emitting VCSEL epitaxial wafer structure, and FIG. 9 shows a bottom-emitting VCSEL epitaxial wafer structure 8. FIG. 8 and FIG. 9 both include two mode filter layers 120 and 121, a first semiconductor layer 130 and a second semiconductor layer 131. The position and number of the current confinement layer or the mode filter layer in FIG. 9 are not limited thereto. For example, the current confinement layer may be disposed above the lower DBR layer 14 and below the upper DBR layer, and the mode filter layer may be disposed below the lower DBR layer and above the substrate. As can be seen from the above, the bottom-emitting VCSEL epitaxial wafer structure also has mode filter layers and current confinement layers such that the mode filter layers and the current confinement layers can be oxidized simultaneously or sequentially.

In the bottom-emitting VCSEL epitaxial wafer structure, when both the current confinement layer and the mode filter layer are disposed in the lower DBR layer, the current confinement layer is closer to the active region than the mode filter layer.

In one embodiment, the substrate of the bottom-emitting VCSEL epitaxial wafer structure can be removed, such that the first metal electrode can be formed by non-alloy process or an alloy process. For the implementation of the non-alloy process, please refer to the description related to FIG. 4b herein. For the implementation of the alloy process, please also refer to the previous description. Although only FIG. 9 shows an embodiment in which the mode filter layer is disposed in the bottom-emitting VCSEL wafer epitaxial structure, the mode filter layer also has other representative embodiments. These other representative embodiments of the mode filter layer can be referred to the embodiments of the top-emitting VCSEL wafer epitaxial structure herein, and the description will not be repeated here.

Figure 10B:
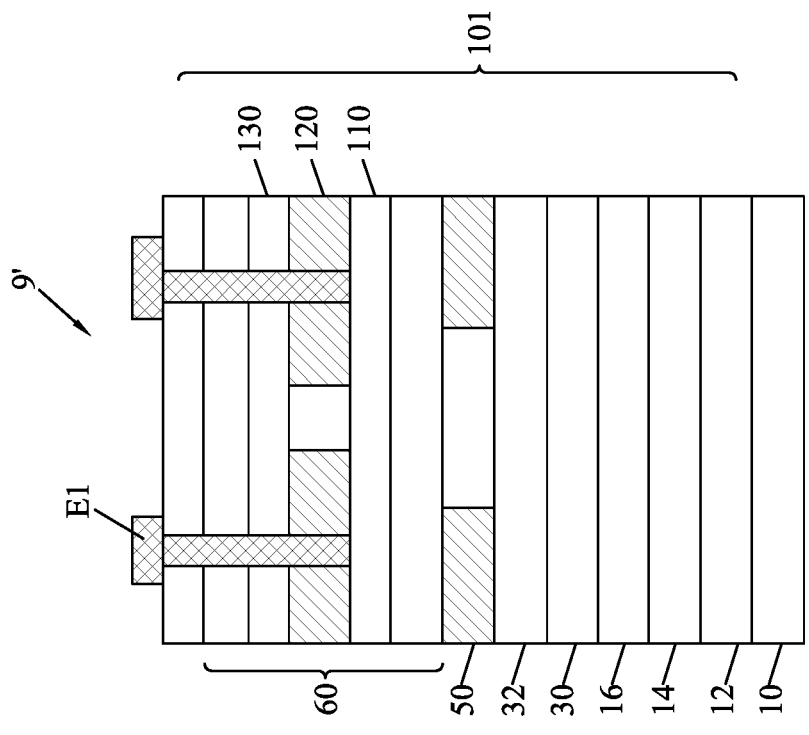
FIG. 10b is a schematic diagram showing the fabrication of the VCSEL epitaxial wafer structure of FIG. 10a into a possible VCSEL semi-finished device.
Figure 10A:
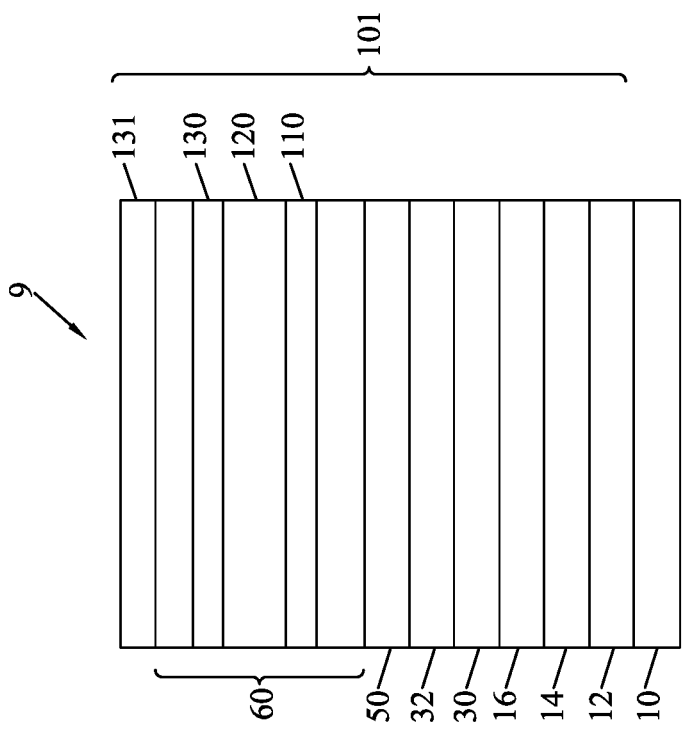
FIG. 10a is a schematic diagram showing a VCSEL epitaxial wafer structure in which the mode filter layer is disposed in the upper DBR layer according to an embodiment of the present disclosure.

As shown in FIG. 10a, the upper DBR layer 60 of the epitaxial stack structure 101 further includes a first ohmic contact layer 110, an mode filter layer 120 and a first semiconductor layer 130. Preferably, when the upper DBR layer 60 on the mode filter layer 120 is not doped, the light absorption rate of the upper DBR layer 60 can be reduced. In one embodiment, the first ohmic contact layer is also disposed in the upper DBR layer, and the mode filter layer may be disposed on the upper DBR layer. The conductive means of the first ohmic contact layer and the first metal electrode can be referred to those described in the above embodiments, which will not be repeated herein.

The VCSEL epitaxial wafer structure 9 of FIG. 10a can be fabricated into various VCSEL semi-finished devices, one of which is the VCSEL semi-finished device 9', as shown in FIG. 10b. According to FIG. 10b, the main current path is to flow through the first metal electrode E1, the first ohmic contact layer 110 and the first current confinement aperture 50a, and then flow into the active region 30.

In any of the embodiments herein, the current confinement layer 50 and the mode filter layer 120 can be oxidized sequentially or simultaneously. After the oxidation process is completed, the current confinement aperture 50a and the optical aperture 120 are formed.

Figure 11:
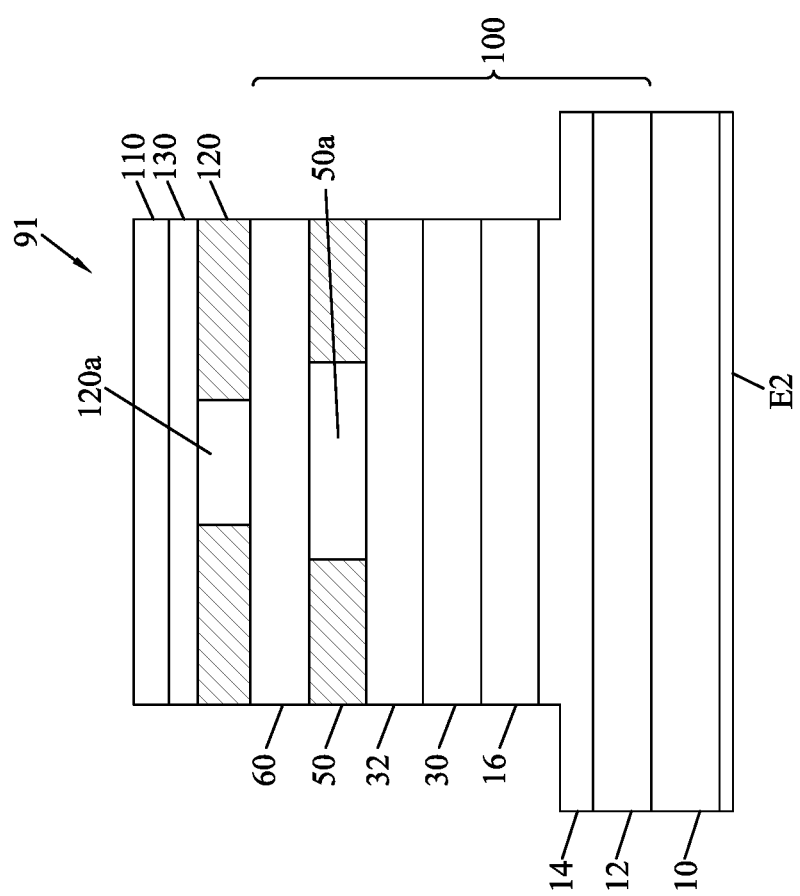
FIG. 11 is a schematic diagram showing a VCSEL semi-finished device according to an embodiment of the present disclosure.

The VCSEL epitaxial wafer structure of FIG. 11 is similar to that of FIG. 6b, but the VCSEL epitaxial wafer structure of FIG. 11 is not provided with the second semiconductor layer 131 of FIG. 6b. The mode filter layer is not limited to be disposed between the upper DBR layer and the first semiconductor layer 130. According to different requirements, the mode filter layer can also be disposed in the upper DBR layer. As mentioned above, the first semiconductor layer in FIG. 11 can also be disposed or adjusted according to different requirements.

In one embodiment, "the unoxidized portion of the mode filter layer" would be a region of constructive interference and "the oxidized portion of the mode filter layer" would be a region of destructive interference, such that an optical path difference thereof is $(2n+1)\lambda/4$, wherein n is a positive integer such as 0, 1, 2 or 3, etc., and $\lambda$, is the emission wavelength of the semiconductor laser device. Under the condition that the above-mentioned optical path difference is satisfied, the mode filter layer does not need to be disposed on the first ohmic contact layer or the outermost layer of the semiconductor laser device, and the semiconductor laser device can also emit laser light with a small divergence angle. According to actual needs, the epitaxial structure can be further adjusted, such as "adjusting the composition (refractive index) or thickness of the mode filter layer itself," "adjust the composition (refractive index) or thickness of one or multiple layers above the mode filter layer," "adjusting the composition (refractive index) or thickness of one or multiple layers between the mode filter layer and the active region" and/or other appropriate adjustments.

In one or some embodiments, when the current confinement layer and the mode filter layer are oxidized at the same time, the current confinement aperture and the optical aperture will have the same center axis. The so-called "simultaneously" does not necessarily mean that the oxidation process must be carried out at the same time and together. If the same oxidation process and/or the same oxidation environment are used, even if the oxidation process is not performed at the same time, the center axis the current confinement aperture and the center axis of the optical aperture can be aligned more precisely as compared to the prior art.

The so-called "aligned" means that the current confinement aperture and the optical aperture having the same center axes, and their profile can be different or the same. "nearly aligned" means that the center axis of the optical aperture is not aligned to the center axis of the current confinement aperture, but they are very close to each other; that is, the degree of misalignment thereof is reduced compared to the conventional surface relief layer formed by means of a photolithography technique.

When the current confinement aperture and the optical aperture having the same center axes, and their profile are circular, the current confinement aperture and the optical aperture are concentric circles, and the divergence angle of the VCSEL can be reduced.

It is well known that the current confinement aperture is to provide the current confinement function and optical confinement function. However, the optical aperture of the mode filter layer is not associated with the current confinement, but a small fraction of the bias current might pass through the optical aperture of the mode filter layer. In order to overcome such problem, the first metal electrode formed by the non-alloy process or alloy process makes the bias current flowing through the first metal electrode larger. That is, the current passing through the optical aperture will be much less, and the resistance of the mode filter layer is mitigated, thereby reducing the influence of the mode filter layer on power conversion efficiency and light output power of the VCSEL.

In one embodiment, the material of the current confinement layer includes at least one material selected from the group consisting of AlGaAs, AlGaAsP, AlAs, AlAsP, AlAsSb, AlAsBi, InAlAs and InAlAsSb.

In one embodiment, the material of the mode filter layer includes at least one material selected from the group consisting of AlGaAs, AlGaAsP, AlAs, AlAsP, AlAsSb, AlAsBi, InAlAs and InAlAsSb.

In one or some embodiments, the current confinement aperture 50a and the optical aperture 120a may be equal or unequal; preferably, when the current confinement aperture is not equal to the optical aperture, it is helpful to reduce the divergence angle.

In one embodiment, the surface-emitting semiconductor laser diode is a top-emitting surface-emitting semiconductor laser diode or a bottom-emitting surface-emitting semiconductor laser diode.

In one embodiment, the oxidation process can be performed by a mesa type process or a non-planar type process. In the mesa type process, the insulation process (oxidation process) is carried out from the outer side of the mesa. That is, the sides of the mode filter layer and the current confinement layer are oxidized laterally. In the non-planar type process, multiple OAs are formed in the multi-layer structure by means of dry etching or wet etching such that the OAs are distributed in different positions of the current confinement layers, and the insulation process is to oxidize and diffuse from the centers of the OAs to the surrounding.

The epitaxial stack structure 100 or 101 is fabricated by metal organic chemical vapor deposition (MOCVD), Molecular Beam Epitaxy (MBE) or other epitaxial growth techniques.

Figure 12:
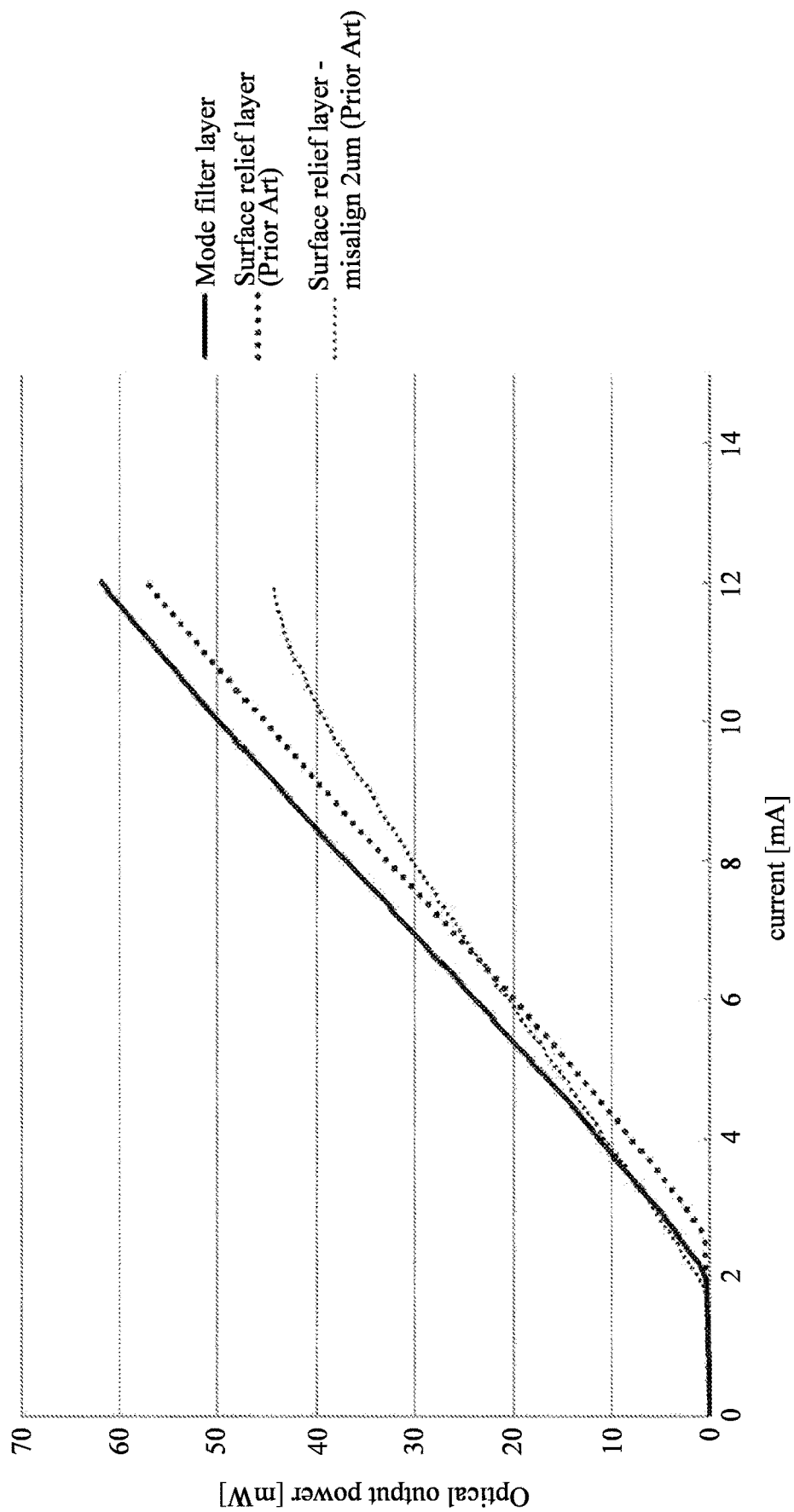
FIG. 12 is a graph showing L-I characteristics of a VCSEL with a mode filter layer and a VCSEL with a surface relief layer.

FIG. 12 is a graph showing L-I characteristics of a VCSEL with a mode filter layer and a VCSEL with a surface relief layer (prior art). The so-called "surface relief layer—misalign 2 µm" in FIG. 12 means that the center axis of the opening of the surface relief layer and the center axis of the current confinement OA are misaligned by about 2 µm. The so-called "surface relief layer" in FIG. 12 means that there is no obvious deviation between the center axis of the opening of the surface layer and the center axis of the current confinement OA. The so-called "mode filter layer" in FIG. 12 means that the center axis of the mode filter layer is precisely aligned with the center axis of the current confinement OA. It can be clearly seen from FIG. 12 that the VCSEL with the mode filter layer has higher optical output power than the VCSEL with the surface relief layer, wherein FIG. 13 is a schematic diagram showing a VCSEL epitaxial wafer structure in which a surface relief layer is disposed on an ohmic contact layer.

Figure 13:
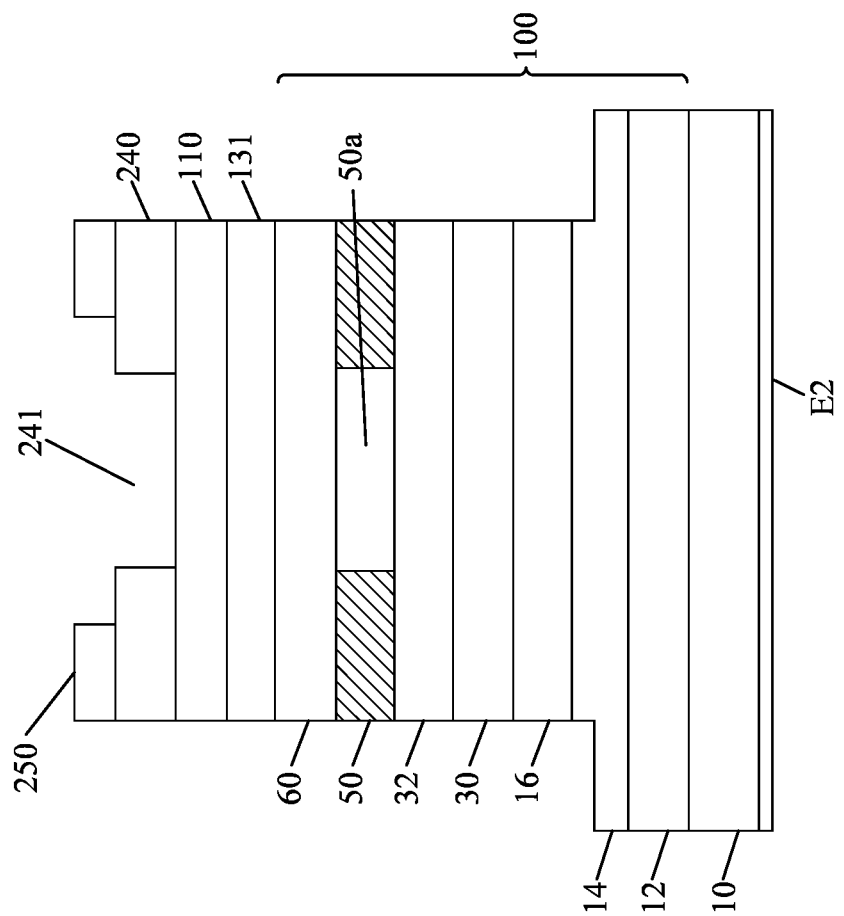
FIG. 13 is a schematic diagram showing a VCSEL epitaxial wafer structure in which a surface relief layer is disposed on an ohmic contact layer (prior art).
Figure 14:
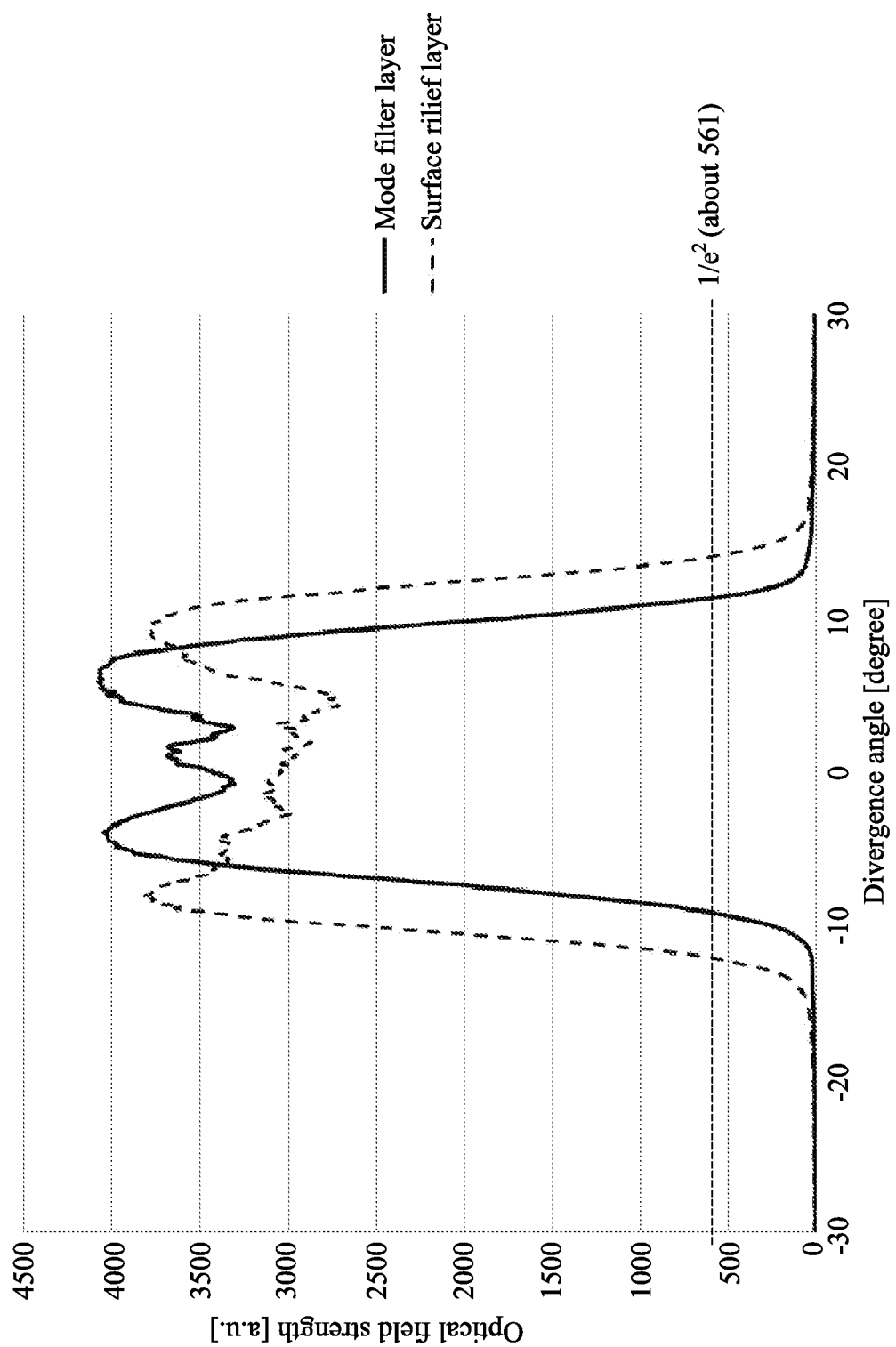
FIG. 14 is a graph showing the far field profiles of the VCSEL of FIG. 7b and the VCSEL of FIG. 13.

FIG. 14 is a schematic diagram showing the far field profiles of the VCSEL of FIG. 7b and the VCSEL of FIG. 13. The diameter of the OA 120a of the mode filter layer of FIG. 7b is 19 m. The diameter of the opening 241 of FIG. 13 is also 19 µm. The diameters of the OAs of the current confinement layers of FIG. 7b and FIG. 13 are 20 µm, and the far field angles of the VCSEL of FIG. 7b and the VCSEL of FIG. 13 are measured at a bias current 10 mA under the continuous wave (CW). As shown in FIG. 14, the far field angle of the structure of FIG. 7b (solid line of FIG. 14) at the $1/e^2$ width is about 20 degrees, while the far field angle of the structure of FIG. 13 (dashed line of FIG. 14) at the $1/e^2$ width is about 24 degrees. It is clear from FIG. 14 that the divergence angle of the dashed line is greater than that of the solid line. As a result, the structure of FIG. 7b has a smaller divergence angle than the structure of FIG. 13.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A vertical-cavity surface-emitting semiconductor laser diode, comprising:
   a substrate; and
   an epitaxial stack structure disposed on the substrate, and comprising:
      an active region;
      an upper DBR layer disposed above the active region;
      a current confinement layer disposed below the upper DBR layer and comprising a current confinement aperture; and
      a mode filter layer disposed above the upper DBR layer and the current confinement layer,
      wherein the mode filter layer further comprises an optical aperture, the mode filter layer and the current confinement layer are able to be oxidized laterally, the optical aperture is formed of unoxidized material after the mode filter layer is oxidized laterally, and the current confinement aperture is formed after the current confinement layer is oxidized laterally such that in a cross section, outermost left sidewalls of the upper DBR layer, the mode filter layer, and the current confinement layer are coplanar, and outermost right sidewalls of the upper DBR layer, the mode filter layer, and the current confinement layer are coplanar;
   wherein the optical aperture of the mode filter layer is not configured to confine the current.

2. The vertical-cavity surface-emitting semiconductor laser diode as claimed in claim 1, further comprising a spacer layer disposed between the upper DBR layer and the mode filter layer, and on the upper DBR layer or beneath the mode filter layer.

3. The vertical-cavity surface-emitting semiconductor laser diode as claimed in claim 1, further comprising a first ohmic contact layer disposed between the upper DBR layer and the mode filter layer.

4. The vertical-cavity surface-emitting semiconductor laser diode as claimed in claim 3, further comprising a first metal electrode disposed within an oxidized portion of the mode filter layer and ohmically contacting the first ohmic contact layer.

5. The vertical-cavity surface-emitting semiconductor laser diode as claimed in claim 3, further comprising a second ohmic contact layer and a first metal electrode, wherein the second ohmic contact layer is disposed above the first ohmic contact layer and the mode filter layer, the mode filter layer is disposed between the second ohmic contact layer and the first ohmic contact layer, a portion of the first metal electrode passes through the mode filter layer, and two ends of the first metal electrode electrically contact the first ohmic metal layer and the second ohmic metal layer, respectively.

6. The vertical-cavity surface-emitting semiconductor laser diode as claimed in claim 1, further comprising a first semiconductor layer disposed on the mode filter layer.

7. The vertical-cavity surface-emitting semiconductor laser diode as claimed in claim 1, further comprising a first ohmic contact layer disposed above the mode filter layer.

8. The vertical-cavity surface-emitting semiconductor laser diode as claimed in claim 7, further comprising a first metal electrode, wherein one end of the first metal electrode is in electrical contact with the first ohmic contact layer, and another end of the first metal electrode passes through the mode filter layer for electrically contacting at least one semiconductor layer below the mode filter layer.

9. The vertical-cavity surface-emitting semiconductor laser diode as claimed in claim 1, wherein the vertical-cavity surface-emitting semiconductor laser diode is a top-emitting vertical-cavity surface-emitting laser (VCSEL) or a bottom-emitting VCSEL, wherein the top-emitting VCSEL is a device emitting radiation away from a top side of the substrate, and the bottom-emitting VCSEL is a device emitting radiation away from a bottom side of the substrate.

10. The vertical-cavity surface-emitting semiconductor laser diode as claimed in claim 1, wherein the optical aperture is formed after the mode filter layer is oxidized laterally from the two sides of the mode filter layer in the cross section, and the current confinement aperture is formed after the current confinement layer is oxidized laterally from the two sides of the current confinement layer in the cross section.

* * * * *